United States Patent
Yang et al.

(10) Patent No.: US 11,557,482 B2
(45) Date of Patent: Jan. 17, 2023

(54) ELECTRODE WITH ALLOY INTERFACE

(71) Applicant: International Business Machines Corporation, Armonk, NY (US)

(72) Inventors: Chih-Chao Yang, Glenmont, NY (US); Daniel Charles Edelstein, White Plains, NY (US); Chao-Kun Hu, Somers, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 16/593,392

(22) Filed: Oct. 4, 2019

(65) Prior Publication Data

US 2021/0104406 A1 Apr. 8, 2021

(51) Int. Cl.
*H01L 21/24* (2006.01)
*H01L 21/324* (2006.01)
*H01L 21/04* (2006.01)
*H01L 21/304* (2006.01)
*H01L 21/768* (2006.01)

(52) U.S. Cl.
CPC .......... *H01L 21/246* (2013.01); *H01L 21/049* (2013.01); *H01L 21/304* (2013.01); *H01L 21/3245* (2013.01); *H01L 21/76849* (2013.01); *H01L 21/76877* (2013.01)

(58) Field of Classification Search
CPC . H01L 21/246; H01L 21/049; H01L 21/3245; H01L 45/1253; H01L 43/08; H01L 21/76849; H01L 2924/01327; H01L 21/244; G11C 5/06
See application file for complete search history.

(56) References Cited

U.S. PATENT DOCUMENTS

| | | | |
|---|---|---|---|
| 7,528,066 B2 | 5/2009 | Yang et al. | |
| 9,245,794 B2 | 1/2016 | Yang et al. | |
| 9,349,691 B2 | 5/2016 | Murray et al. | |
| 9,875,966 B1 | 1/2018 | Yang | |
| 2002/0123219 A1 | 9/2002 | Laverty et al. | |
| 2003/0008495 A1* | 1/2003 | Hsue | H01L 21/76867 257/E21.582 |
| 2006/0113675 A1 | 6/2006 | Chang et al. | |
| 2016/0064648 A1 | 3/2016 | Tsubata et al. | |
| 2017/0053967 A1 | 2/2017 | Chuang et al. | |
| 2017/0352804 A1* | 12/2017 | Chuang | H01L 43/02 |
| 2018/0040814 A1 | 2/2018 | Park | |
| 2019/0165258 A1* | 5/2019 | Peng | H01L 43/08 |

* cited by examiner

*Primary Examiner* — Tuan A Hoang
(74) *Attorney, Agent, or Firm* — L. Jeffrey Kelly; Michael J. Chang, LLC (57) ABSTRACT

An electrode structure with an alloy interface is provided. In one aspect, a method of forming a contact structure includes: patterning a via in a first dielectric layer; depositing a barrier layer onto the first dielectric layer, lining the via; depositing and polishing a first metal layer (Element A) into the via to form a contact in the via; depositing a second metal layer (Element B) onto the contact in the via; annealing the first and second metal layers under conditions sufficient to form an alloy AB; depositing a third metal layer onto the second metal layer; patterning the second and third metal layers into a pedestal stack over the contact to form an electrode over the contact, wherein the alloy AB is present at an interface of the electrode and the contact; and depositing a second dielectric that surrounds the pedestal stack. A contact structure is also provided.

8 Claims, 14 Drawing Sheets

ELECTRODE WITH ALLOY INTERFACE

FIELD OF THE INVENTION

The present invention relates to interconnect designs for semiconductor devices, and more particularly, to an electrode structure and techniques for fabrication thereof with an alloy interface.

BACKGROUND OF THE INVENTION

The formation of interconnects for semiconductor devices typically involves patterning features such as vias in a dielectric, and then filling the vias with a conductor. Conventional techniques often employ processes such as chemical vapor deposition (CVD) or physical vapor deposition (PVD) to fill the vias with the conductor.

However, filling a feature using PVD or CVD is a challenge especially with the small feature size of a via. Oftentimes, the result is the formation of a void (i.e., unfilled space) inside the feature. Voids can lead to undesirable characteristics such as increased resistance, or even disconnects in extreme cases.

Therefore, improved interconnect designs and techniques for formation thereof would be desirable.

SUMMARY OF THE INVENTION

The present invention provides an electrode structure and techniques for fabrication thereof with an alloy interface. In one aspect of the invention, a method of forming a contact structure is provided. The method includes: patterning a via in a first dielectric layer; depositing a barrier layer onto the first dielectric layer, lining the via; depositing a first metal layer including an Element A into and filling the via; polishing the first metal layer to form a contact in the via; depositing a second metal layer including an Element B onto the contact in the via; annealing the first metal layer and the second metal layer under conditions sufficient to form an alloy AB; depositing a third metal layer onto the second metal layer; patterning the second metal layer and the third metal layer into a pedestal stack over the contact in the via, wherein a patterned portion of the second metal layer forms an electrode over the contact in the via, and wherein the alloy AB is present at an interface of the electrode and the contact in the via; and depositing a second dielectric layer onto the first dielectric layer that surrounds the pedestal stack.

In another aspect of the invention, another method of forming a contact structure is provided. The method includes: depositing a first dielectric layer over a dielectric structure having at least one metal line; patterning a via in the first dielectric layer over a select one of the metal lines; depositing a barrier layer onto the first dielectric layer, lining the via; depositing a first metal layer including an Element A into and filling the via, wherein the Element A is a metal selected from: copper (Cu), aluminum (Al), tungsten (W), cobalt (Co), ruthenium (Ru), and combinations thereof; polishing the first metal layer to form a contact in the via; depositing a second metal layer including an Element B onto the contact in the via, wherein the Element B is a metal selected from: tantalum (Ta), tantalum nitride (TaN), titanium (Ti), titanium nitride (TiN), ruthenium (Ru), ruthenium nitride (RuN), cobalt (Co), cobalt nitride ($C_2N$), tungsten (W), tungsten nitride (WN), iridium (Ir), rhodium (Rh), and combinations thereof; annealing the first metal layer and the second metal layer under conditions sufficient to form an alloy AB; depositing a third metal layer onto the second metal layer; patterning the second metal layer and the third metal layer into a pedestal stack over the contact in the via, wherein a patterned portion of the second metal layer forms an electrode over the contact in the via, and wherein the alloy AB is present at an interface of the electrode and the contact in the via; and depositing a second dielectric layer onto the first dielectric layer that surrounds the pedestal stack.

In yet another aspect of the invention, a contact structure is provided. The contact structure includes: a via patterned in a first dielectric layer; a barrier layer lining the via; a contact in the via including an Element A, wherein the Element A is a metal selected from: Cu, Al, W, Co, Ru, and combinations thereof; a pedestal stack formed over the contact in the via, wherein the pedestal stack has a metal layer over an electrode including an Element B, and wherein the Element B is a metal selected from: Ta, TaN, Ti, TiN, Ru, RuN, Co, $Co_2N$, W, WN, Ir, Rh, and combinations thereof; an alloy AB at an interface of the electrode and the contact in the via; and a second dielectric layer disposed on the first dielectric layer that surrounds the pedestal stack.

A more complete understanding of the present invention, as well as further features and advantages of the present invention, will be obtained by reference to the following detailed description and drawings.

DETAILED DESCRIPTION OF PREFERRED EMBODIMENTS

As provided above, filling features having small feature sizes such as vias using conventional process such as chemical vapor deposition (CVD) or physical vapor deposition (PVD) can undesirably lead to void formation within the features. Advantageously, provided herein are improved techniques for contact fabrication where a unique electrode structure is formed, e.g., over a via contact, with an alloy interface formed therebetween.

An exemplary methodology for forming a contact structure in accordance with the present techniques is now described. The process begins with the formation of interconnects (i.e., metal lines and/or conductive vias) in a dielectric or multi-layer dielectric structure. Specifically, in the example depicted in FIG. 1, a multi-layer dielectric structure 101 is employed having at least a first interlayer dielectric (ILD) 102 separated from a second ILD 106 by a dielectric capping layer 104.

Figure 1:
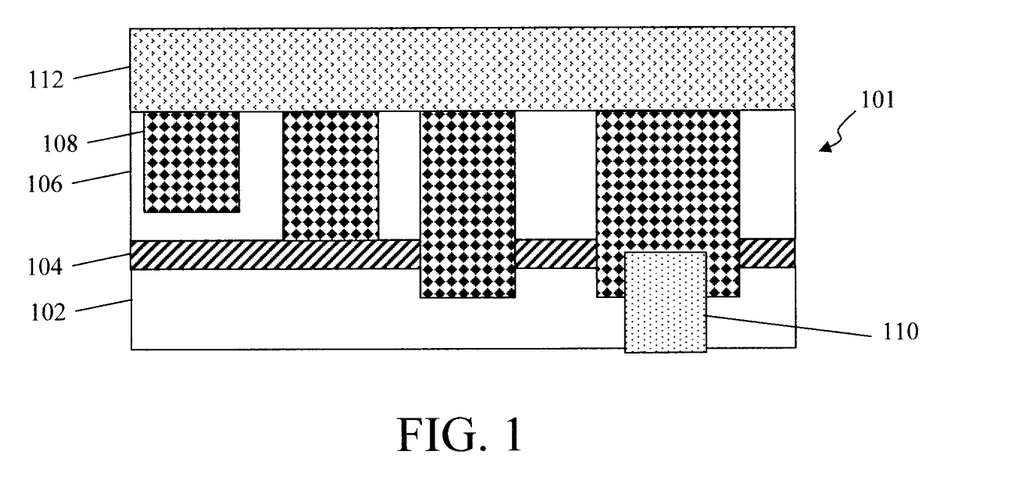
FIG. 1 is a cross-sectional diagram illustrating a (first) dielectric layer having been deposited onto a dielectric structure having metal lines and conductive vias formed therein according to an embodiment of the present invention.

Suitable dielectric materials for ILD 102/106 include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). Suitable dielectric capping materials for layer 104 include, but are not limited to, silicon carbide (SiC), silicon nitride (SiN) and/or silicon carbonitride (SiCN).

To form the interconnects in multi-layer dielectric structure 101, features such as trenches, vias, or combinations thereof are first patterned in ILD 102, capping layer 104 and/or ILD 106. The features are then filled with a metal(s) such as copper (Cu), aluminum (Al), tungsten (W), cobalt (Co) and/or ruthenium (Ru) to form metal lines 108 and conductive vias 110 in the trenches and vias, respectively. Although not explicitly shown in the figures, the metal lines 108 and conductive vias 110 can be lined with a barrier layer. Suitable barrier layer materials include, but are not limited to, tantalum (Ta), tantalum nitride (TaN), titanium (Ti), titanium nitride (TiN), Ru, ruthenium nitride (RuN), ruthenium tantalum (RuTa), ruthenium tantalum nitride (RuTaN), W and/or tungsten nitride (WN). Optionally, a seed layer (not shown) is formed on the barrier layer. A seed layer facilitates plating of the metal into metal lines 108 and conductive vias 110. Suitable seed layer materials include, but are not limited to, Cu, Cu-alloys, iridium (Ir), Ir-alloys, Ru and/or Ru-alloys.

According to an exemplary embodiment, a damascene/dual damascene process is used to form the metal lines 108 and conductive via 110. With a dual damascene process, a trench is patterned on top of a via, and then the trench and via are filled with a conductor to form a metal line and conductive via, respectively (see, e.g., the rightmost metal line 108 on top of conductive via 110). With the dual damascene process, the trench can be patterned before the via, or vice versa. When the trench is patterned before the via, it is referred to herein as a "trench-first" process. Alternatively, when the via is patterned before the trench, it is referred to herein as a "via-first" process.

A first dielectric layer 112 is then deposited onto ILD 106 over metal lines 108 and conductive via 110. Suitable dielectric materials for layer 112 include, but are not limited to, SiOx, SiCOH, pSiCOH, SiC, SiN and/or SiCN.

Figure 2:
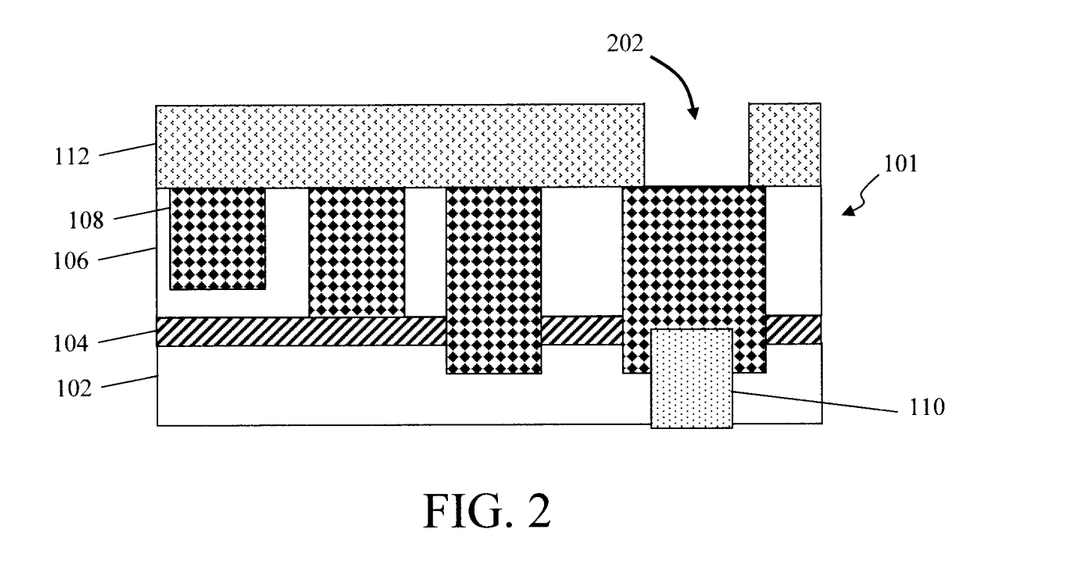
FIG. 2 is a cross-sectional diagram illustrating a via having been patterned in the first dielectric layer over one of the metal lines according to an embodiment of the present invention.

As shown in FIG. 2, at least one via 202 is then patterned in dielectric layer 112 over a select one or more of the metal lines 108. In this particular example, via 202 exposes the rightmost metal line 108. Standard lithography and etching techniques can be employed to pattern via 202 in dielectric layer 112 using, e.g., a directional (anisotropic) etching process such as reactive ion etching (RIE) for the via etch.

Figure 3:
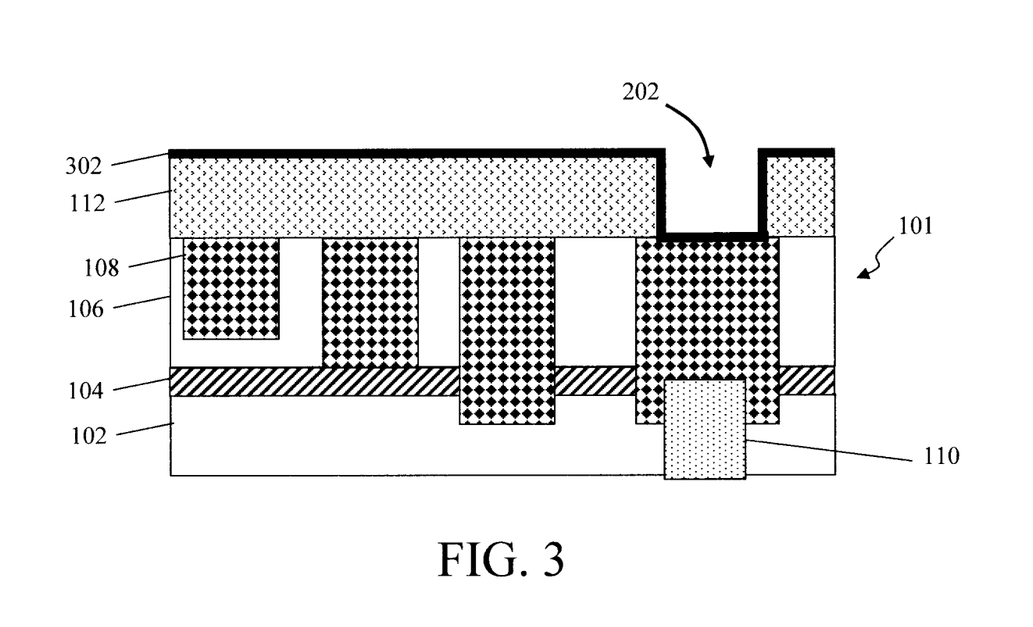
FIG. 3 is a cross-sectional diagram illustrating a barrier layer having been deposited onto the first dielectric layer, lining the via according to an embodiment of the present invention.

As shown in FIG. 3, a barrier layer 302 is then deposited onto dielectric layer 112/select metal line(s) 108 and lining via 202. As provided above, suitable barrier layer materials include, but are not limited to, Ta, TaN, Ti, TiN, Ru, RuN, RuTa, RuTaN, W and/or WN. According to an exemplary embodiment, barrier layer 302 is deposited conformally using a process such as chemical vapor deposition (CVD), plasma enhanced chemical vapor deposition (PECVD), atomic layer deposition (ALD), physical vapor deposition (PVD), sputtering, chemical solution deposition or electroplating, to a thickness of from about 2 nanometers (nm) to about 50 nm, and ranges therebetween. Optionally, a seed layer (not shown) is formed on the barrier layer to facilitate plating. As provided above, suitable seed layer materials include, but are not limited to, Cu, Cu-alloys, Ir, Ir-alloys, Ru and/or Ru-alloys.

Figure 4:
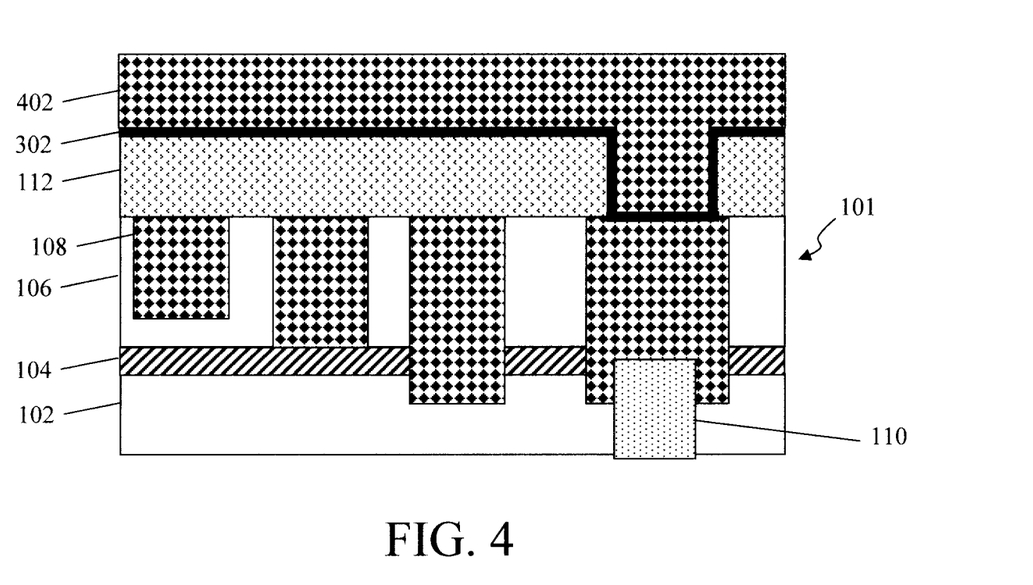
FIG. 4 is a cross-sectional diagram illustrating a (first) metal layer (including an Element A) having been deposited onto the barrier layer over the first dielectric layer and filling the via according to an embodiment of the present invention.

As shown in FIG. 4, a first metal layer 402 (Element A) is then deposited onto barrier layer 302 over dielectric layer 112/select metal line(s) 108 into and filling via 202. As will be described in detail below, this Element A and a subsequently deposited Element B (see below) will be used to form an alloy at the interface of first metal layer 402 and an overlying electrode structure. According to an exemplary embodiment, Element A is a metal including, but not limited to, copper (Cu), aluminum (Al), tungsten (W), cobalt (Co) and/or ruthenium (Ru). First metal layer 402 can be deposited using a process such as evaporation, sputtering, electroplating, etc. According to an exemplary embodiment, electroplating is used to deposit first metal layer 402. Further, the same metal (or combination of metals) can be used for first metal layer 402 and metal lines 108. For instance, to use a non-limiting, illustrative example, both metal lines 108 and first metal layer 402 can include Cu or a Cu alloy.

Figure 5:
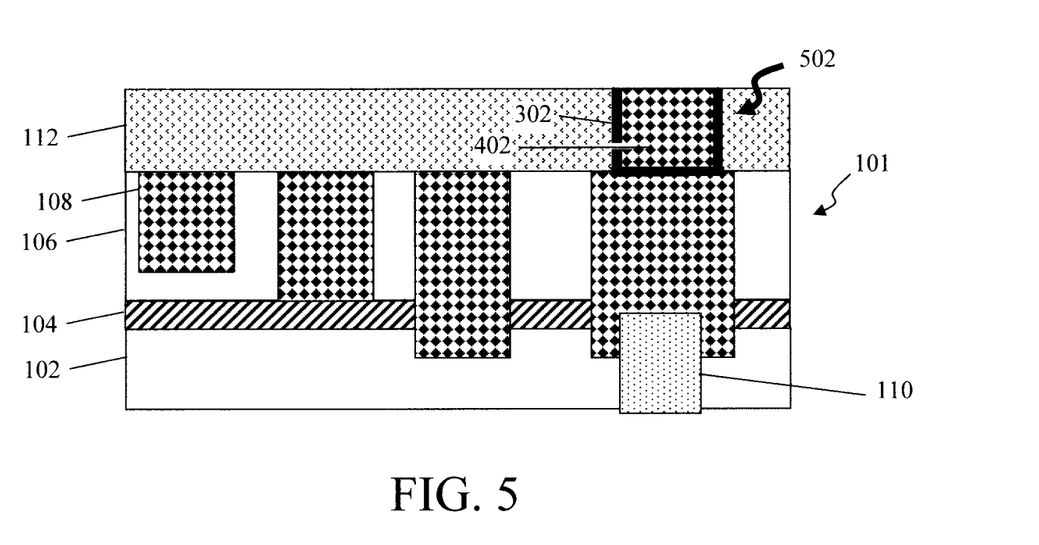
FIG. 5 is a cross-sectional diagram illustrating the first metal layer and the barrier layer having been polished down to the first dielectric layer forming a via contact according to an embodiment of the present invention.

A polishing process such as chemical-mechanical polishing (CMP) is then used to remove the overburden from the top surface of dielectric layer 112 (along with barrier layer 302) such that first metal layer 402 and barrier layer 302 remain present only in via 202, forming a via contact. This polishing step can be carried out in a couple of different ways. For instance, in one exemplary embodiment, CMP is used to polish first metal layer 402 and barrier layer 302 down to the surface of dielectric layer 112. See FIG. 5. In that case, what remains of first metal layer 402 in via 202 (i.e., via contact 502) is coplanar with the top surface of dielectric layer 112. Alternatively, according to another exemplary embodiment that will be described in detail below, the CMP is not endpointed when the overburden is removed, but is continued to intentionally create a recess in the first metal layer 402 present in via 202, such that the via contact is recessed below the top surface of dielectric layer 112. Recessing the via contact this manner advantageously increases the area of the interface alloy (see below).

Figure 6:
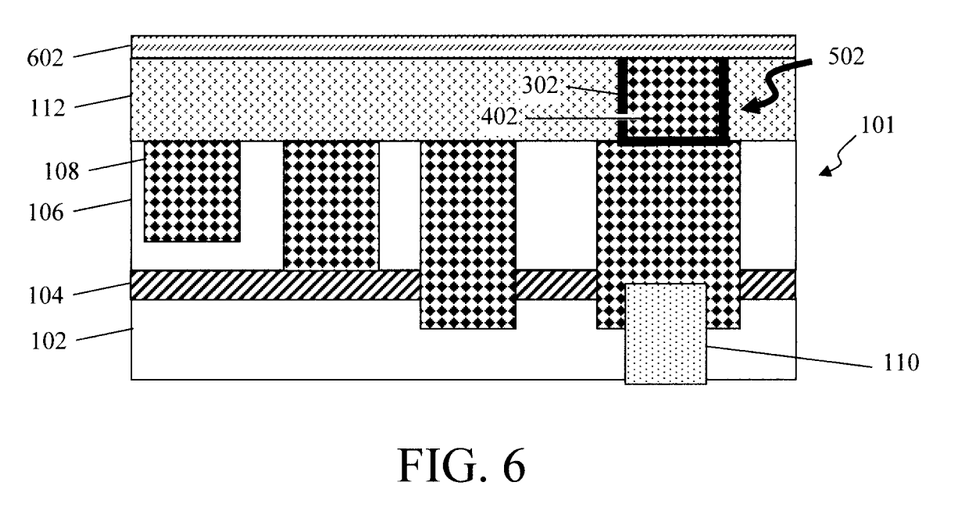
FIG. 6 is a cross-sectional diagram illustrating a second metal layer (including an Element B) having been deposited onto the first dielectric layer over and in direct contact with the via contact according to an embodiment of the present invention.

As shown in FIG. 6, a second metal layer 602 (Element B) is then deposited onto dielectric layer 112 over and in direct contact with via contact 502. As highlighted above, Element A of first metal layer 402 in via 202 and this Element B will be used to form an alloy at the interface of via 202/via contact 502 and an overlying electrode structure. According to an exemplary embodiment, Element B is a metal including, but not limited to, Ta, TaN, Ti, TiN, Ru, RuN, Co, cobalt nitride ($Co_2N$), W, WN, Ir, and/or rhodium (Rh). Second metal layer 602 can be deposited using a process such as evaporation, sputtering, electroplating, etc. According to an exemplary embodiment, a different metal (or combination of metals) is used for first metal layer 402 than for second metal layer 602. For instance, to use a non-limiting, illustrative example, Element A of first metal layer 402 can include Cu, and Element B of second metal layer 602 can include Ta. Following deposition, second metal layer 602 can be polished using a process such as CMP. Direct contact of the Element A of first metal layer 402 and Element B of second metal layer 602 is needed to form the interface alloy therebetween.

Figure 7:
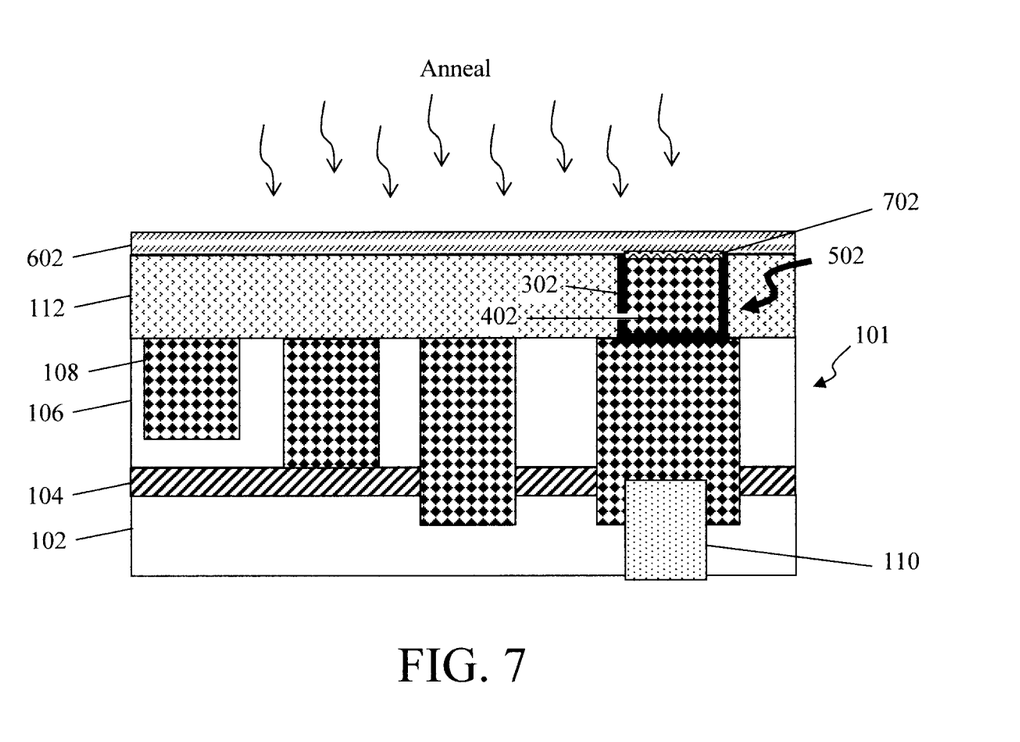
FIG. 7 is a cross-sectional diagram illustrating an anneal of the first metal layer (Element A) and the second metal layer (Element B) having been performed under conditions sufficient to form an alloy AB at the interface of the via contact and the second metal layer according to an embodiment of the present invention.

As shown in FIG. 7, an anneal of Element A/first metal layer 402 and Element B/second metal layer 602 is next performed under conditions sufficient to form an alloy AB 702 at the interface of via contact 502 and second metal layer 602. Namely, the anneal serves to react Element A from first metal layer 402/via contact 502 with Element B from second metal layer 602 to form alloy AB 702 therebetween. To use a simple, non-limiting example, if Element A of first metal layer 402 includes Cu, and Element B of second metal layer 602 includes Ta, then alloy AB 702 formed would be a tantalum-copper alloy.

According to one exemplary embodiment, the anneal is performed using a furnace anneal and the conditions include, but are not limited to, a temperature of from about 80° C. to about 450° C. and ranges therebetween, and a duration of from about 20 minutes to about 5 hours and ranges therebetween. According to another exemplary embodiment, the anneal is performed using a laser anneal and the conditions include, but are not limited to, a temperature of from about 450° C. to about 2000° C. and ranges therebetween, and a duration of from about 5 nanoseconds to about 50 nanoseconds and ranges therebetween.

Figure 8:
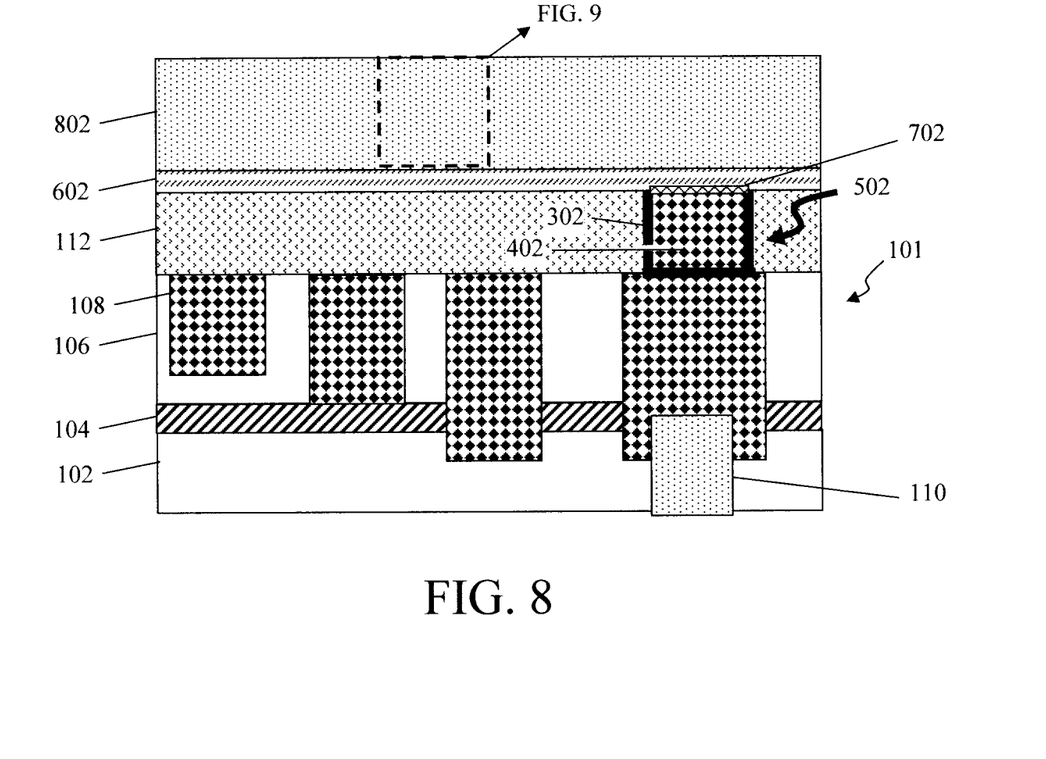
FIG. 8 is a cross-sectional diagram illustrating a third metal layer having been deposited onto the second metal layer according to an embodiment of the present invention.

As shown in FIG. 8, a third metal layer 802 is then deposited onto second metal layer 602. Third metal layer 802 can include one or more distinct layers. For instance, according to one exemplary embodiment, third metal layer 802 is configured as an interconnect. Suitable interconnect metals include, but are not limited to, Cu, Al, W, Co and/or Ru, which can be contained in a single layer or in multiple layers, i.e., as a metal stack.

Figure 9:
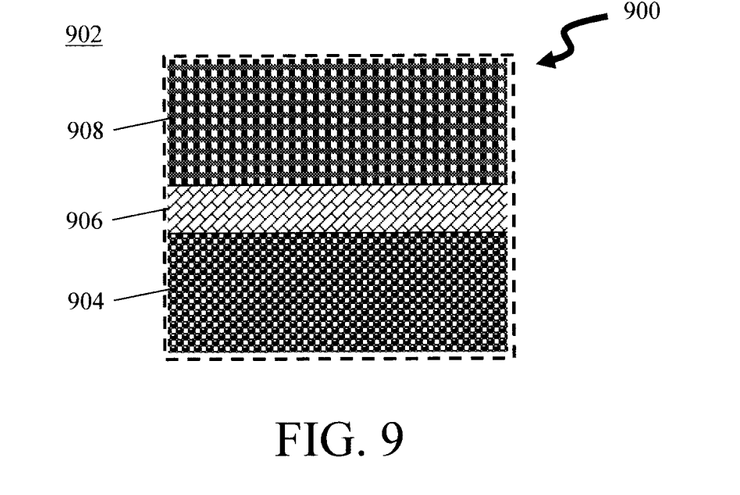
FIG. 9 is an enlarged view of the third metal layer when the third metal layer is optionally configured as a magnetic tunnel junction (MTJ) according to an embodiment of the present invention.

According to another exemplary embodiment, third metal layer 802 is configured as a memory device stack, such as a magnetic random access memory (MRAM) stack. Generally, an MRAM stack includes a magnetic tunnel junction (MTJ) having (e.g., first and second) magnetic metal layers separated by a tunnel barrier. By way of example only, suitable materials for the magnetic metal layers include, but are not limited to, Co, iron (Fe), nickel (Ni), Co alloys, Fe alloys and/or Ni alloys. Suitable materials for the tunnel barrier include, but are not limited to, aluminum (Al) and/or magnesium (Mg) oxides. See, for example, FIG. 9 which provides an enlarged view 900 of third metal layer 802 when configured as an MTJ 902. As shown in FIG. 9, MTJ 902 includes a magnetic metal layer 904 separated from a magnetic metal layer 908 by a tunnel barrier 906. As provided above, suitable materials for the magnetic metal layers 904 and 908 include, but are not limited to, Co, Fe, Ni, Co alloys, Fe alloys and/or Ni alloys.

The tunnel barrier 906 isolates magnetic metal layer 904 from magnetic metal layer 908. However, since the tunnel barrier 906 is ultra-thin, electrons can tunnel through the tunnel barrier 906 from one magnetic metal layer to the other. For instance, according to an exemplary embodiment, the tunnel barrier 906 has a thickness of from about 2 nm to about 3 nm and ranges therebetween. As provided above, suitable materials for the tunnel barrier 906 include, but are not limited to, Al and/or magnesium oxides.

Figure 10:
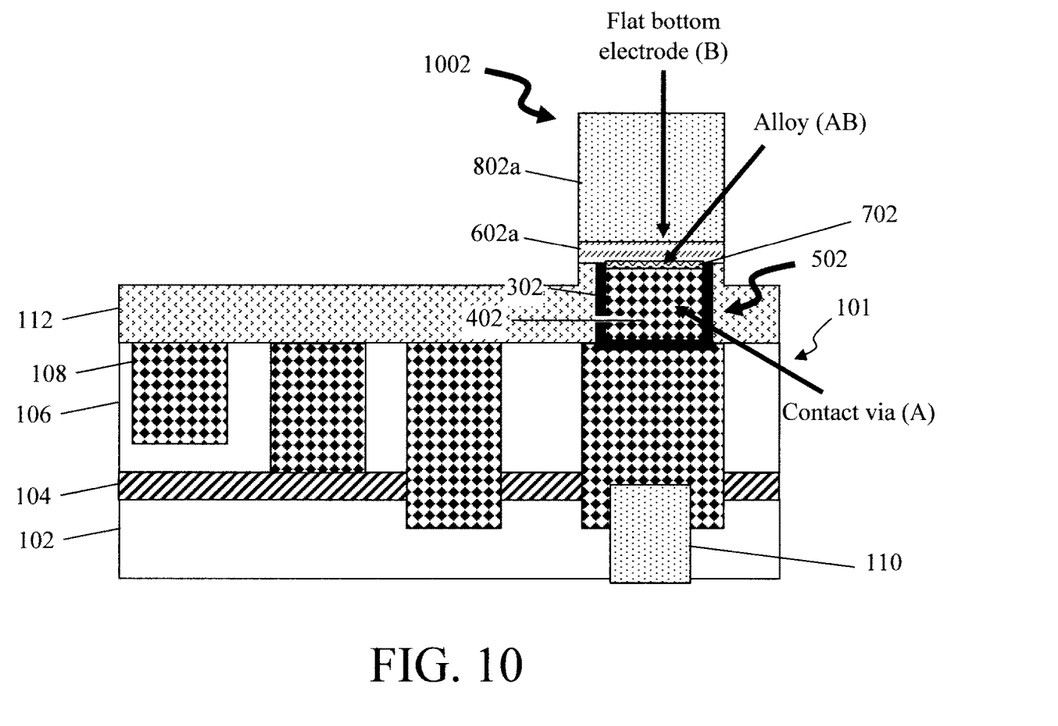
FIG. 10 is a cross-sectional diagram illustrating the second metal layer and third metal layer having been patterned into a pedestal stack over the via contact that contains a patterned portion of the second metal layer which forms a flat bottom electrode (Element B) over the via contact (Element A) with the alloy AB at the interface of the electrode and the via contact according to an embodiment of the present invention.

As shown in FIG. 10, second metal layer 602 and third metal layer 802 are then patterned into a pedestal stack 1002 over via contact 502 which contains a patterned portion 602a of the second metal layer and a patterned portion 802a of the third metal layer. Standard lithography and etching techniques can be employed for the patterning using, e.g., a directional (anisotropic) etching process such as RIE. As shown in FIG. 10, patterned second metal layer 602a forms an electrode (Element B) over via contact 502 (Element A) with alloy AB 702 at the interface of the electrode and the via contact 502. In this particular example, the electrode has a flat bottom. However, in the case of a recessed via contact (see below), the electrode can have a rounded, convex bottom that extends into the recess.

Figure 11:
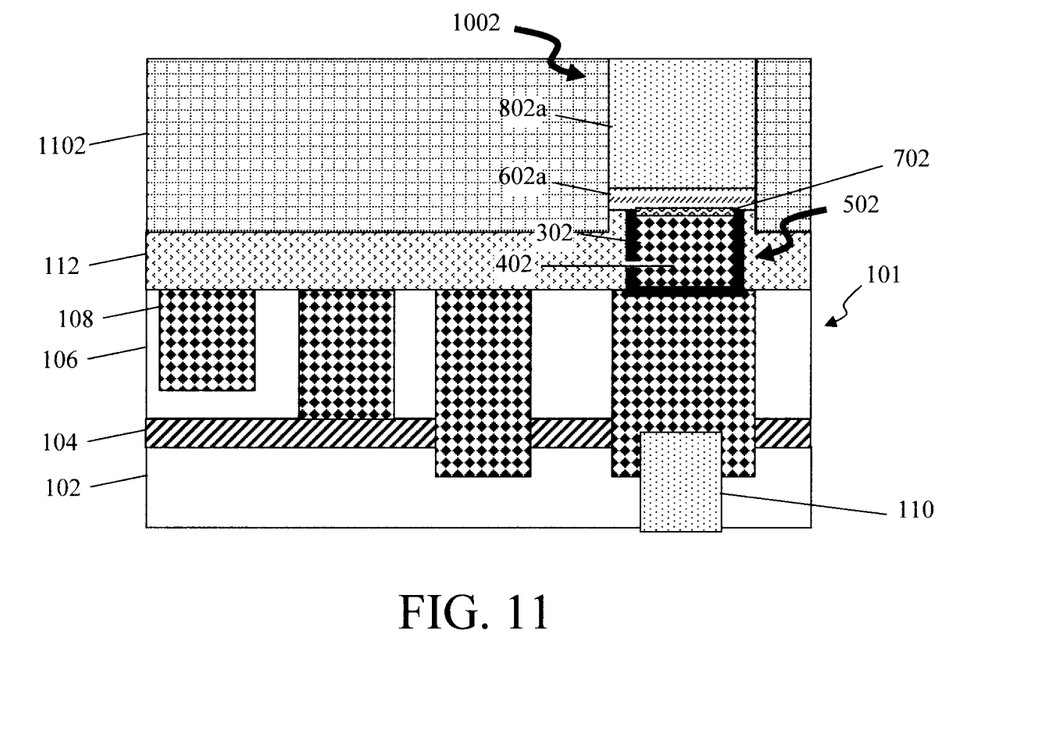
FIG. 11 is a cross-sectional diagram illustrating a (second) dielectric layer having been deposited onto the first dielectric layer, surrounding the pedestal stack according to an embodiment of the present invention.

As shown in FIG. 11, a (second) dielectric layer 1102 is deposited onto dielectric layer 112, surrounding the pedestal stack 1002. Suitable dielectric materials for layer 1102 include, but are not limited to, SiOx, SiCOH and/or pSiCOH. Following deposition, dielectric layer 1102 can be polished down to the pedestal stack 1002 using a process such as CMP.

Figure 12:
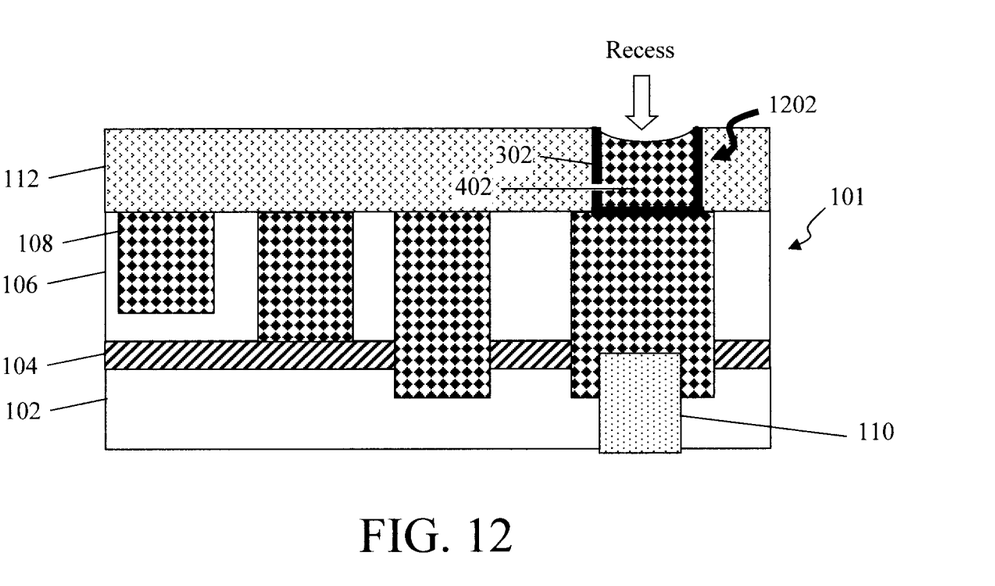
FIG. 12 is a cross-sectional diagram which follows from FIG. 4 illustrating, according to an alternative embodiment, the first metal layer having been polished so as to intentionally create a recess in the via contact according to an embodiment of the present invention.

As highlighted above, according to an alternative embodiment, CMP of the first metal layer 402 and barrier layer 302 can be carried out so as to intentionally create a recess in the first metal layer 402 present in via 202. See FIG. 12 where metal layer 402 present in via 202 (i.e., via contact 1202) is recessed. The structure shown in FIG. 12 follows from what is depicted in FIG. 4, and like structures are numbered alike in the figures. Recessing via contact 1202 advantageously increases the area of the interface alloy (see below).

Figure 13:
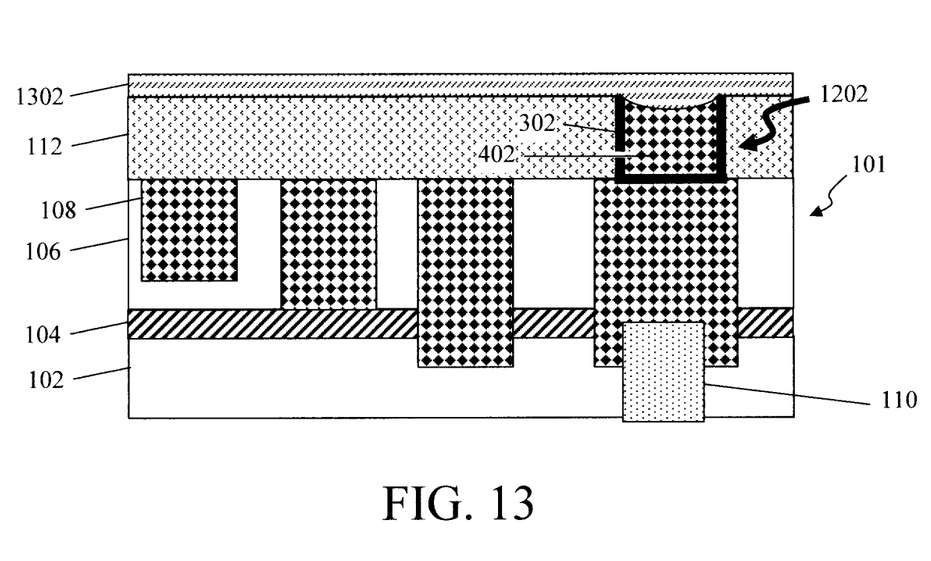
FIG. 13 is a cross-sectional diagram illustrating a second metal layer (including Element B) having been deposited onto the first dielectric layer over and in direct contact with the (recessed) via contact according to an embodiment of the present invention.

As shown in FIG. 13, a second metal layer 1302 (Element B) is then deposited onto dielectric layer 112 over and in direct contact with via contact 1202. In the same manner as above, Element A of first metal layer 402 in via 202 and this Element B will be used to form an alloy at the interface of via 202/via contact 1202 and an overlying electrode structure. According to an exemplary embodiment, Element B is a metal including, but not limited to, Ta, TaN, Ti, TiN, Ru, RuN, Co, $Co_2N$, W, WN Ir, and/or Rh. Second metal layer 1302 can be deposited using a process such as evaporation, sputtering, electroplating, etc. According to an exemplary embodiment, a different metal (or combination of metals) is used for first metal layer 402 than for second metal layer 1302. For instance, to use a non-limiting, illustrative example, Element A of first metal layer 402 can include Cu, and Element B of second metal layer 1302 can include Ta. Following deposition, second metal layer 1302 can be polished using a process such as CMP.

Notably, as shown in FIG. 13, second metal layer 1302 fills the recess in via contact 1202. Direct contact of the Element A of first metal layer 402 and Element B of second metal layer 1302 is needed to form the interface alloy therebetween.

Figure 14:
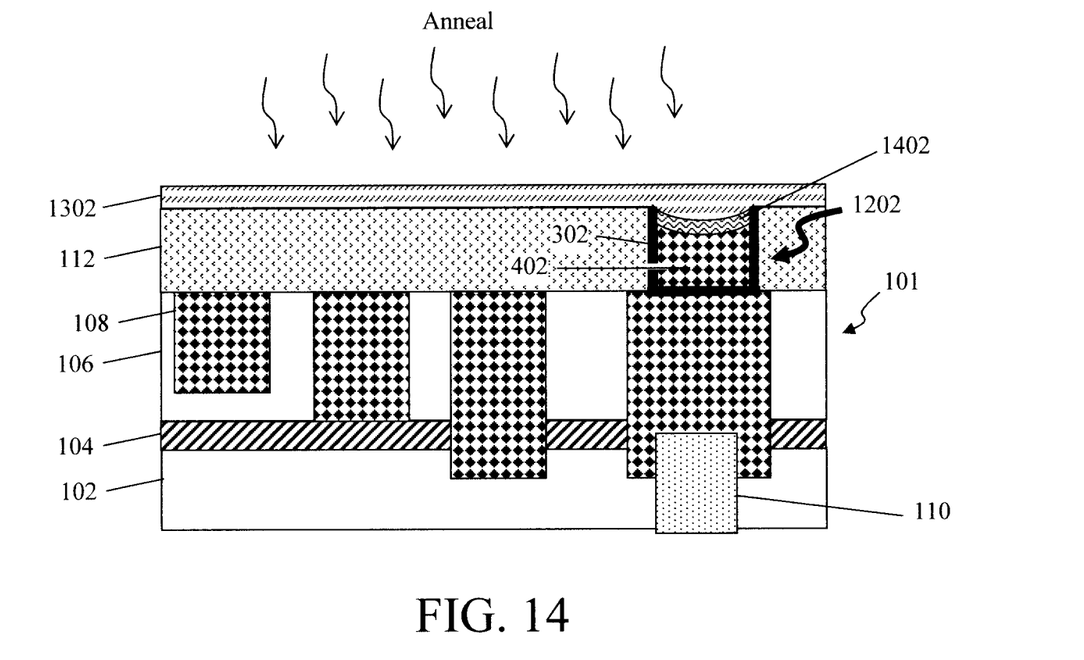
FIG. 14 is a cross-sectional diagram illustrating an anneal of the first metal layer (Element A) and the second metal layer (Element B) having been performed under conditions sufficient to form an alloy AB at the interface of via contact and the second metal layer according to an embodiment of the present invention.

As shown in FIG. 14, an anneal of Element A/first metal layer 402 and Element B/second metal layer 1302 is next performed under conditions sufficient to form an alloy AB 1402 at the interface of via contact 1202 and second metal layer 1302. Namely, the anneal serves to react Element A from first metal layer 402/via contact 1202 with Element B from second metal layer 1302 to form alloy AB 702 therebetween. To use a simple, non-limiting example, if Element A of first metal layer 402 includes Cu, and Element B of second metal layer 1302 includes Ta, then alloy AB 1402 formed would be a tantalum-copper alloy.

According to one exemplary embodiment, the anneal is performed using a furnace anneal and the conditions include, but are not limited to, a temperature of from about 80° C. to about 450° C. and ranges therebetween, and a duration of from about 20 minutes to about 5 hours and ranges therebetween. According to another exemplary embodiment, the anneal is performed using a laser anneal and the conditions include, but are not limited to, a temperature of from about 450° C. to about 2000° C. and ranges therebetween, and a duration of from about 5 nanoseconds to about 50 nanoseconds and ranges therebetween.

The remainder of the process is the same as the preceding embodiment, and as such, multiple steps might be combined into a single figure. For instance, in the same manner as described above, a third metal layer is then deposited onto second metal layer 1302, and patterned into a pedestal stack 1504 over via contact 1202 which contains a patterned portion 1302a of the second metal layer and a patterned portion 1502a of the third metal layer. See FIG. 15.

Figure 15:
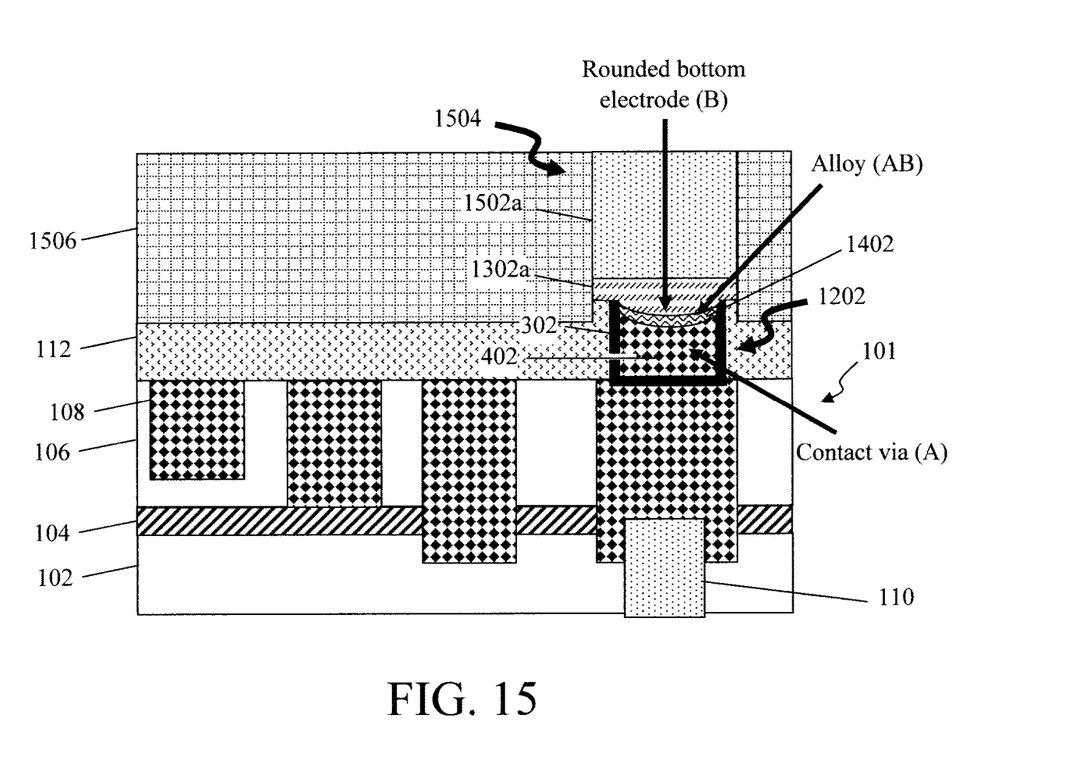
FIG. 15 is a cross-sectional diagram illustrating a third metal layer having been deposited onto the second metal layer, and patterned into a pedestal stack over the (recessed) via contact that contains a patterned portion of the second metal layer which forms a rounded bottom electrode (Element B) over the via contact (Element A) with the alloy AB at the interface of the electrode and the via contact, and a (second) dielectric layer having been deposited onto the first dielectric layer surrounding the pedestal stack according to an embodiment of the present invention.

As described above, third metal layer 1502a can include one or more distinct layers. For instance, according to one exemplary embodiment, third metal layer 1502a is configured as an interconnect. Suitable interconnect metals include, but are not limited to, Cu, Al, W, Co and/or Ru, which can be contained in a single layer or in multiple layers, i.e., as a metal stack. In another exemplary embodiment, third metal layer 1502a is configured as a memory device stack, such as an MRAM stack having an MTJ with magnetic metal layers separated by a tunnel barrier. As provided above, suitable materials for the magnetic metal layers include, but are not limited to, Co, Fe, Ni, Co alloys, Fe alloys and/or Ni alloys. Suitable materials for the tunnel barrier include, but are not limited to, Al and/or Mg oxides. An exemplary MTJ was described in conjunction with the description of FIG. 9, above.

As shown in FIG. 15, patterned second metal layer 1302a forms an electrode (Element B) over via contact 1202 (Element A) with alloy AB 1402 at the interface of the electrode and the via contact 1202. In this particular example, the electrode has a rounded, convex bottom that extends into the recess of via contact 1202.

A (second) dielectric layer 1506 is deposited onto dielectric layer 112, surrounding the pedestal stack 1504. Suitable dielectric materials for layer 1506 include, but are not limited to, SiOx, SiCOH and/or pSiCOH. Following deposition, dielectric layer 1506 can be polished down to the pedestal stack 1504 using a process such as CMP.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A contact structure, comprising:
    a via patterned in a first dielectric layer;
    a barrier layer lining the via;
    a contact in the via comprising an Element A, wherein the Element A is a metal selected from the group consisting of: copper (Cu), aluminum (Al), tungsten (W), cobalt (Co), ruthenium (Ru), and combinations thereof;
    a pedestal stack formed over the contact in the via, wherein the pedestal stack has a metal layer over an electrode, the electrode comprising an Element B, wherein the Element B is a metal selected from the group consisting of: ruthenium nitride (RuN), cobalt nitride ($Co_2N$), tungsten nitride (WN), iridium (Ir), rhodium (Rh), and combinations thereof, and wherein the metal layer and the electrode share common sidewalls that extend partially into the first dielectric layer on opposite sides of the contact;
    an alloy AB in between, and in direct contact with both, the electrode and the contact in the via, wherein the alloy AB comprises an alloy of the Element A and the Element B; and
    a second dielectric layer disposed on the first dielectric layer that surrounds the pedestal stack, wherein the second dielectric layer is in direct contact with an entire vertical surface of both the electrode and the metal layer, and wherein a horizontal surface of the second dielectric layer is coplanar with a top surface of the metal layer to either side of the pedestal stack.

2. The contact structure of claim 1, wherein the contact in the via is recessed below a top surface of the first dielectric layer.

3. The contact structure of claim 1, wherein the metal layer comprises a metal selected from the group consisting of: Cu, Al, W, Co, Ru, and combinations thereof.

4. The contact structure of claim 1, wherein the metal layer is a memory device stack comprising:
    a first magnetic metal layer;

a second magnetic metal layer; and a tunnel barrier separating the first magnetic metal layer from the second magnetic metal layer.

5. The contact structure of claim 1, wherein the first dielectric layer comprises a material selected from the group consisting of: silicon oxide (SiOx), organosilicate glass (SiCOH), porous organosilicate glass (pSiCOH), silicon carbide (SiC), silicon nitride (SiN), silicon carbonitride (SiCN), and combinations thereof.

6. The contact structure of claim 1, wherein the barrier layer comprises a material selected from the group consisting of: Ta, TaN, Ti, TiN, Ru, RuN, ruthenium tantalum (RuTa), ruthenium tantalum nitride (RuTaN), W, WN, and combinations thereof.

7. The contact structure of claim 1, wherein the first dielectric layer is disposed over a dielectric structure comprising metal lines, and wherein the via is patterned in the first dielectric layer over a select one of the metal lines.

8. The contact structure of claim 1, wherein the Element A is Co.

\* \* \* \* \*